(12) United States Patent
Ito

(10) Patent No.: US 7,528,476 B2
(45) Date of Patent: May 5, 2009

(54) SEMICONDUCTOR DEVICE, METHOD FOR MANUFACTURING SEMICONDUCTOR DEVICE, CIRCUIT BOARD, AND ELECTRONIC INSTRUMENT

(75) Inventor: Haruki Ito, Chino (JP)

(73) Assignee: Seiko Epson Corporation (JP)

( * ) Notice: Subject to any disclaimer, the term of this patent is extended or adjusted under 35 U.S.C. 154(b) by 460 days.

(21) Appl. No.: 11/305,471

(22) Filed: Dec. 16, 2005

(65) Prior Publication Data

US 2006/0131721 A1   Jun. 22, 2006

(30) Foreign Application Priority Data

Dec. 21, 2004   (JP)   ............... 2004-369081

(51) Int. Cl.
*H01L 23/48* (2006.01)
*H01L 23/52* (2006.01)
*H01L 29/40* (2006.01)

(52) U.S. Cl. ............... 257/689; 257/737; 257/E25.013; 257/E23.02; 257/E23.048

(58) Field of Classification Search ........... 257/689, 257/737, E23.07, E23.02, E23.048, E25.013
See application file for complete search history.

(56) References Cited

U.S. PATENT DOCUMENTS

| | | | |
|---|---|---|---|
| 6,600,234 B2 | 7/2003 | Kuwabara et al. | |
| 6,707,153 B2 | 3/2004 | Kuwabara et al. | |
| 7,151,012 B2 * | 12/2006 | Huang | 438/108 |
| 2001/0028105 A1 * | 10/2001 | Hashimoto et al. | 257/686 |
| 2003/0064545 A1 | 4/2003 | Gacusan | |
| 2003/0094683 A1 | 5/2003 | Poo et al. | |
| 2004/0106335 A1 | 6/2004 | Nemoto et al. | |
| 2004/0113222 A1 | 6/2004 | Ozguz et al. | |
| 2004/0192033 A1 * | 9/2004 | Hara | 438/667 |
| 2006/0131721 A1 * | 6/2006 | Ito | 257/689 |
| 2007/0298538 A1 * | 12/2007 | Tanabe et al. | 438/107 |
| 2008/0073790 A1 * | 3/2008 | Burrell et al. | 257/758 |

FOREIGN PATENT DOCUMENTS

| | | |
|---|---|---|
| JP | 60-007149 | 1/1985 |
| JP | 06-169031 | 6/1994 |
| JP | 10-223833 | 8/1998 |
| JP | 2000-223518 | 8/2000 |
| JP | 2001-284376 | 10/2001 |
| JP | 2003-273106 | 9/2003 |
| JP | 2003-282819 | 10/2003 |
| JP | 2004-273525 | 9/2004 |
| WO | WO01/71805 | 9/2001 |

* cited by examiner

*Primary Examiner*—Walter L Lindsay, Jr.
(74) *Attorney, Agent, or Firm*—Harness, Dickey & Pierce, P.L.C.

(57) ABSTRACT

A semiconductor device includes: a semiconductor substrate having an active surface and a back surface; an integrated circuit formed on the active surface; a feedthrough electrode penetrating the semiconductor substrate, and projecting from the active surface and the back surface; a first resin layer formed on the active surface, having a thickness greater than a height of a portion of the feedthrough electrode that projects from the active surface, and having an opening portion for exposing at least a portion of the feedthrough electrode; a wiring layer which is formed on the first resin layer, and which is connected to the feedthrough electrode through the opening portion; and an external connecting terminal connected to the wiring layer.

9 Claims, 7 Drawing Sheets

SEMICONDUCTOR DEVICE, METHOD FOR MANUFACTURING SEMICONDUCTOR DEVICE, CIRCUIT BOARD, AND ELECTRONIC INSTRUMENT

This application claims priority to Japanese Patent Application No. 2004-369081, filed Dec. 21, 2004, the contents of which are incorporated herein by reference.

BACKGROUND

1. Technical Field

The present invention relates to a semiconductor device, a method for manufacturing the semiconductor device, a circuit board, and an electronic instrument.

2. Related Art

Recently, electronic parts such as semiconductor devices, which are installed in an electronic instrument, have been downsized in electronic instruments such as a mobile phone, a notebook model personal computer, or a PDA (Personal Data Assistant), with the demand for miniaturization and weight reduction. Under such circumstances, a proposal has been made regarding a three-dimensional packaging technology with respect to the semiconductor device. The three-dimensional packaging technology is for stacking semiconductor devices which have functions similar to one another. In addition, the three-dimensional packaging technology may be for stacking semiconductor devices which have functions different from one another. More particularly, disclosure is made in JP-A-2003-282819 about a technology for packaging a plurality of semiconductor devices on a substrate, as an art. In the art, a plurality of semiconductor devices each of which has a feedthrough electrode is stacked, and the semiconductor device of the bottom layer is packaged on an interposer substrate. After that, relocation and rerouting are performed in order to package a plurality of semiconductor devices on the substrate.

However, it is desired that a layered product of semiconductor devices which are packaged on the substrate be small and thin. In order to achieve this, it is necessary to perform further improvement.

SUMMARY

An advantage of some aspects of the invention is to provide a semiconductor device for use in a still smaller and still thinner layered product, with respect to a semiconductor device which has feedthrough electrodes and which is capable of being packaged on a substrate by three-dimensional packaging technology. Another advantage of some aspects of the invention is to provide a method for manufacturing the semiconductor device, a circuit board, and an electronic instrument having the circuit board.

The inventors have obtained the following findings as a result of intensive research, in order to resolve the above-mentioned problems.

It is possible to make a layered product of semiconductor devices be still thinner when eliminating an interposer substrate on which the semiconductor device of bottom layer is packaged. In order to eliminate the interposer substrate and to make the semiconductor device thinner, a method is thought in which a wiring layer is formed which is connected to feedthrough electrodes projecting from a semiconductor substrate, and rerouting is performed with respect to the semiconductor device. However, there is another problem in that breakage easily occurs in the wiring layer due to a stepped portion between the feedthrough electrodes and the semiconductor substrate.

Under such circumstances, the inventors have made the above-mentioned step small by forming a resin layer on the semiconductor substrate, in order to prevent breakage in the wiring layer. As a result, the inventors realized the invention.

A first aspect of the invention provides a semiconductor device includes a semiconductor device includes: a semiconductor substrate having an active surface and a back surface; an integrated circuit formed on the active surface; a feedthrough electrode penetrating the semiconductor substrate, and projecting from the active surface and the back surface; a first resin layer formed on the active surface, having a thickness greater than a height of a portion of the feedthrough electrode that projects from the active surface, and having an opening portion for exposing at least a portion of the feedthrough electrode; a wiring layer which is formed on the first resin layer, and which is connected to the feedthrough electrode through the opening portion; and an external connecting terminal connected to the wiring layer.

According to the semiconductor device of the first aspect of invention, since the first resin layer is formed at the active surface of the semiconductor substrate, it is possible to prevent the breakage between the feedthrough electrode and the wiring layer by the opening portion, in which the height of the opening portion is lower than the step between the semiconductor substrate and the feedthrough electrode. In addition, since the wiring layer is smoothly formed along a taper shape in which the opening portion formed in the first resin layer has the taper shape, it is possible to connect the wiring layer to the feedthrough electrode without breakage.

Since the first resin layer is disposed at the active surface of the semiconductor substrate, the first resin layer functions as a stress reducing layer even if external forces are applied to the external connecting terminal and the wiring layer on packaging the semiconductor device on the semiconductor substrate. As a result, it is possible to reduce the forces applied to a connection section between the wiring layer and the feedthrough electrode. Accordingly, it is possible to improve connection reliability in the connecting section.

Since the semiconductor device includes the external connecting terminal which is connected to the feedthrough electrode, it is possible to form the relocation and rerouting in the semiconductor device without using an interposer substrate. Therefore, it is possible to further downsize and thin the semiconductor device, since it is unnecessary to use the interposer substrate.

It is preferable that the semiconductor device of the first aspect of the invention include a second resin layer formed on the first resin layer, having a thickness greater than a thickness of the wiring layer, and less than a thickness of the first resin layer, and exposing a portion of the wiring layer connected to the external connecting terminal.

As described above, since the second resin layer exposes the wiring layer which is connected to the external connecting terminal, it is possible to use the second resin layer as a partition wall on forming the external connecting terminal. In addition, it is possible to protect the wiring layer, since the semiconductor device has the second resin layer which covers the wiring layer. Since the second resin layer has a thickness which is less than the thickness of the first resin layer, it is possible to reduce a film stress applied to the second resin layer and it is possible to reduce the amount of a warp which occurs in the semiconductor substrate.

It is preferable that the second resin layer formed in a region which is positioned in the first resin layer in plan view, in the semiconductor device of the first aspect of the invention.

As a result, it is possible to reduce an area of the second resin layer formed on the first resin layer. It is possible to further reduce the warp which occurs in the semiconductor substrate.

It is preferable that the semiconductor device of the first aspect of the invention include a third resin layer formed on the back surface of the semiconductor substrate, and exposing at least an end surface of the feedthrough electrode.

Accordingly, it is possible to reduce the warp which occurs in the semiconductor substrate, by the first and the second resin layers which are formed at the active surface of semiconductor substrate, since the third resin layer is formed on the back surface of the semiconductor substrate. In addition, it is possible to stack semiconductor devices when the semiconductor devices are connected to one another by the feedthrough electrodes, each of which positioned at the back surface, since the third resin layer exposes at least a portion of the feedthrough electrode.

It is preferable that the semiconductor device of the first aspect of the invention include other semiconductor device or electronic elements connected to a portion of the feedthrough electrode that projects from the back surface of the semiconductor substrate.

Therefore, it is possible to obtain a small semiconductor device having a high density and a high performance, since the other semiconductor device or the electronic parts are stacked on the semiconductor device which does not use the interposer substrate.

It is preferable that the semiconductor device of the first aspect of the invention include a second wiring layer connected to the portion of the feedthrough electrode that projects from the back surface of the semiconductor substrate.

Since the semiconductor device has the second wiring layer connected to the feedthrough electrode which projects to the back surface of the semiconductor substrate, it is possible to flexibly select the semiconductor device and the electronic parts which should be packaged on the semiconductor device, when locating the second wiring layer in various positions.

It is preferable that the semiconductor device of the first aspect of the invention include a resin molding the other semiconductor device or the electronic parts which are packaged on the back surface.

Since the other semiconductor device or the electronic parts are molded by the resin layer, it is possible to reliably hold the other semiconductor device or the electronic parts packaged on the semiconductor device. As a result, it is possible to improve reliability in the semiconductor device.

A second aspect of the invention provides a circuit board includes the above-mentioned semiconductor device.

As described above, the semiconductor device is capable of being packaged without using the interposer substrate. Furthermore, the semiconductor device prevents the breakage in a rerouting section. In addition, the semiconductor device has a thinned size and a high density. As a result, it is possible for the circuit board to have a small size and high reliability according to the circuit board of the second aspect of the invention, since the circuit board has the above-mentioned semiconductor device.

A third aspect of the invention provides an electronic instrument includes the above-mentioned circuit board.

Since the electronic instrument according to the invention has a small circuit board having high reliability, it is possible for the electronic instrument to have a small size and high reliability.

A forth aspect of the invention provides a method for manufacturing a semiconductor device, includes: providing a semiconductor substrate having an active surface with an integrated circuit, and a back surface; forming a feedthrough electrode projecting from the active surface and the back surface through the semiconductor substrate; forming a first resin layer on the active surface, having a thickness greater than a height of a portion of the feedthrough electrode that projects from the active surface, and having an opening portion for exposing at least a portion of the feedthrough electrode; forming a wiring layer which is connected to the feedthrough electrode through the opening portion; and forming an external connecting terminal connected to the wiring layer.

According to the method for manufacturing the semiconductor device of the forth aspect of the invention, it is possible to prevent the breakage between the feedthrough electrode and the wiring layer by the opening portion, in which the height of the opening portion is lower than the step between the semiconductor substrate and the feedthrough electrode. In addition, it is possible to smoothly connect the wiring layer to the feedthrough electrode along a taper shape in which the opening portion formed in the first resin layer has the taper shape. As a result, it is possible to prevent the wiring layer from breakage based on concavity and convexity which occur between the semiconductor substrate and the feedthrough electrode.

Since the formed external connecting terminal is connected to the wiring layer, the first resin layer functions as a stress reducing layer even if external forces are applied to the external connecting terminal on packaging the semiconductor device on the semiconductor substrate. As a result, it is possible to improve connecting reliability in a connecting section between the wiring layer and the feedthrough electrode.

Since the semiconductor device includes the external connecting terminal which is connected to the feedthrough electrode, it is possible to form the relocation and rerouting in the semiconductor device without using an interposer substrate. Therefore, it is possible to downsize and thin the semiconductor device, since it is unnecessary to use the interposer substrate.

It is preferable that the method for manufacturing a semiconductor device of the forth aspect of the invention include: using a semiconductor wafer as the semiconductor substrate; and cutting the semiconductor wafer to obtain individual semiconductor devices, after a plurality of semiconductor devices is formed on the semiconductor wafer.

Since it is possible to obtain the individual semiconductor devices when the semiconductor wafer is cut into individual semiconductor devices after a plurality of semiconductor devices are formed on the semiconductor wafer, it is possible to increase productivity on manufacturing the semiconductor devices.

It is preferable that the first resin layer be formed on the active surface so as not to overlap with a cutting part of the semiconductor substrate, in the method for manufacturing the semiconductor device of the forth aspect of the invention.

Since the first resin layer is not formed on the cutting part, it is possible to prevent the first resin layer from peeling, on obtaining the individual semiconductor devices.

It is preferable that the forming of the feedthrough electrode include: forming an aperture portion on which the active surface of the semiconductor substrate, and which communicates with a conductive portion of the integrated circuit which is formed at the active surface; forming a conductive portion in the aperture portion; and thinning the semiconductor substrate from the back surface so as to form the feedthrough electrode, in the method for manufacturing the semiconductor device of the forth aspect of the invention.

In which a penetration aperture is formed in the semiconductor substrate in order to form the feedthrough electrode in the semiconductor substrate, there is a concern in that the semiconductor substrate breaks when the semiconductor substrate is thin. According to the invention, the aperture portion is formed on the active surface and the conductive portion is formed in the aperture portion. Furthermore, the semiconductor substrate is thinned from the back surface in order to form the feedthrough electrode. Therefore, it is possible to obtain a small semiconductor device having the feedthrough electrode while preventing the semiconductor substrate from breaking.

It is preferable that the semiconductor device of the forth aspect of the invention include forming a third resin layer on the back surface of the semiconductor substrate so as to expose at least the feedthrough electrode.

Since it is possible to control the film stress applied to the first resin layer which is formed on the active surface, by the third resin layer formed on the back surface of the semiconductor substrate, it is possible to reduce the warp which occurs in each of the semiconductor substrate and the semiconductor wafer.

It is preferable that the forming of the third resin layer includes: exposing a photo-sensitive resin and developing the photo-sensitive resin so as to form an opening portion which is for exposing at least a feedthrough electrode projecting to the back surface; after forming the opening portion, contacting the feedthrough electrode and the third resin layer by flowing a melted resin; and after contacting the feedthrough electrode and the third resin layer, curing the photo-sensitive resin, in the method for manufacturing the semiconductor device of the forth aspect of the invention.

Since the opening portion is formed which exposes at least the feedthrough electrode, it is possible to easily perform an alignment with respect to the feedthrough electrode on forming the third resin layer, even though the feedthrough electrode has a small shape. In addition, since flowing a melted third resin layer before the third resin layer cured by curing the third resin layer, the third resin layer is in contact with the feedthrough electrode through the third resin layer. As a result, it is possible to prevent short-circuitting, since a brazing filler metal is not directly in contact with the semiconductor substrate through the third resin layer even if the brazing filler metal between the feedthrough electrodes drips down.

It is preferable the forming of the third resin layer include: coating the third resin on the back surface so as to cover the feedthrough electrode; and exposing the feedthrough electrode by a plasma treatment, in the method for manufacturing the semiconductor device of the forth aspect of the invention.

Since it is unnecessary to perform an alignment with respect to the semiconductor device, it is possible to simplify the manufacturing processes. In addition, it is possible to prevent short-circuitting by the third resin layer on stacking the semiconductor devices as described above.

It is preferable that the forming of the third resin layer include: covering the feedthrough electrode with a polymer film; heating the feedthrough electrode covered with the polymer film; and crimping the polymer film to the back surface of the semiconductor substrate so as to penetrate the polymer film by the feedthrough electrode projecting from the back surface, in the method for manufacturing the semiconductor device of the forth aspect of the invention.

Since it is unnecessary to perform an alignment with respect to the semiconductor device, it is possible to simplify the manufacturing processes. In addition, it is possible to prevent short-circuitting by the third resin layer on stacking the semiconductor devices as described above.

DESCRIPTION OF EXEMPLARY EMBODIMENTS

A description will be made as regards a semiconductor device, a method for manufacturing the semiconductor device, a circuit board, and an electronic instrument according to embodiments of the invention.

First, a description will proceed to the semiconductor device according to an embodiment of the invention.

Figure 1:
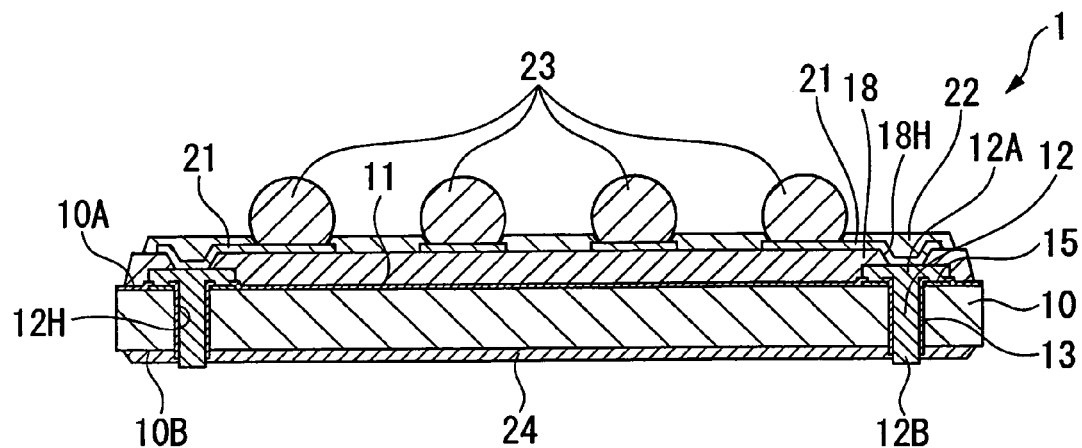
FIG. 1 is a cross-sectional view of a semiconductor device according to an embodiment of an aspect of the invention.

FIG. 1 is a cross-sectional view illustrating a semiconductor device 1 according to the embodiment. As shown in FIG. 1, the semiconductor device 1 includes a semiconductor substrate 10 composed of a silicon substrate which is obtained by cutting off a silicon wafer. An integrated circuit (not shown) composed of transistors, memory elements, and other electronic elements are formed on an active surface 10A of the semiconductor substrate 10. Feedthrough electrodes 12 are formed in the semiconductor substrate 10 and penetrate from the active surface 10A to a back surface 10B which is opposite to the active surface 10A. In each of the feedthrough electrodes 12 in the embodiment, the outside shape of a terminal portion which is positioned at the side of the active surface 10A is larger than the outside shape of the terminal portion which is positioned at the side of the back surface 10B. Each of the feedthrough electrodes 12 is shaped into a circular shape or a square shape in plan view. In addition, the semiconductor substrate 10 has aperture portions 12H for use in forming the feedthrough electrodes 12.

An insulating film 13 is formed on a wall of each aperture portion 12H. The insulating film 13 allows each of the feedthrough electrodes 12 to be electrically insulated from the semiconductor substrate 10. In the description below, the terminal portion, which projects to the side of active surface 10A, will be referred to as a first electrode portion 12A in each of the feedthrough electrodes 12. The terminal portion, which projects to the side of the back surface 10B, will be referred to as a second electrode portion 12B in each of the feedthrough electrodes 12.

A foundation layer 11 is formed on the active surface 10A of the semiconductor substrate 10. The foundation layer 11 may be composed of an insulating material such as silicon dioxide ($SiO_2$). In addition, electrodes 15 are formed on the foundation layer 11 and a first insulating layer 14 (not shown in FIG. 1) is formed on the foundation layer 11 except in regions on which the electrodes 15 are formed. The electrodes 15 are connected to the first electrode portions 12A of the feedthrough electrodes 12.

It is preferable that a height between an upper surface of the first electrode portion 12A and the active surface 10A be less than 20 μm.

In the side of the active surface 10A, a first resin layer 18 composed of a photo-sensitive resin such as polyimide resin is formed on the semiconductor substrate 10. The first resin layer 18 has a thickness which is greater than the height of the first electrode portion 12A which projects to the side of the active surface 10A. For example, the thickness of the first resin layer 18 is 20 μm in the present embodiment.

Opening portions 18H are formed on the first resin layer 18. Each of the opening portions 18H is for exposing at least a portion of the upper surface of each of the first electrode portions 12A which projects to the side of the active surface 10A. Each of the opening portions 18H is shaped into a taper shape in which each of the opening portions 18H has an inner diameter which becomes narrow towards each of the first electrode portions 12A. Wiring layers 21, which are connected to the first electrode portions 12A through the opening portions 18H, respectively, are formed on the first resin layer 18. As a result, each of the wiring layers 21 is smoothly formed along the taper shape of each opening portion 18H and it is possible to prevent each of the wiring layers 21 from breakage based on each of the steps between the semiconductor substrate 10 and the first electrode portions 12A.

A second resin layer 22 is formed on the first resin layer 18. The second resin layer 22 has a thickness which is greater than the thickness of each wiring layer 21 and which is less than the thickness of the first resin layer 18. The second resin layer 22 covers the wiring layers 21 formed on the first resin layer 18. As a result, it is possible to protect the wiring layers 21 from external forces. Since the second resin layer 22 has the thickness which is less than the thickness of the first resin layer 18, it is possible to reduce film stress which is applied to the second resin layer 22. As a result, it is possible to reduce the warp which occurs in the semiconductor substrate 10.

In addition, exposed regions connected to external connecting terminals which will be described hereinafter are defined by the second resin layer 22. Solder balls (external connecting terminals) 23 are formed on the wiring layers 21 which are exposed from the second resin layer 22. It is preferable that the second resin layer 22 has a thickness in which it is possible to use the second resin layer 22 as a partition wall on forming the solder balls 23 on the wiring layers 21.

When the solder balls 23 are connected to the feedthrough electrodes 12 through the wiring layers 21d, the solder balls 23 are electrically connected to the integrated circuit mounted or packaged on the active surface 10A of the semiconductor substrate 10.

Accordingly, it is possible to improve the packaging with respect to the semiconductor device 1, when forming the relocation and rerouting with respect to the feedthrough electrodes 12 which are formed on the semiconductor substrate 10, by using the solder balls 23 and the wiring layers 21.

A third resin layer 24 is formed on the back surface 10B of the semiconductor substrate 10. The third resin layer 24 exposes at least an end face of the second electrode portions 12B. The third resin layer 24 is composed of polyimide resin which is similar to the above-mentioned first resin layer 18. The third resin layer 24 reducees the warp which occurs in the semiconductor substrate 10, together with the first and the second resin layers 18 and 22 which are formed on the side of the active surface 10A of the semiconductor substrate 10. The third resin layer 24 is closely in contact with the side surface portions of the feedthrough electrodes 12 in the present embodiment, since the feedthrough electrodes 12 penetrate the third resin layer 24. Therefore, it is possible to connect the semiconductor device 1 to semiconductor parts by only the second electrode portions 12B which penetrate the third resin layer 24 in a case of packaging the semiconductor parts on the semiconductor device 1, because of insulating the semiconductor substrate 10.

Next, a description will proceed to a method for manufacturing the semiconductor device 1 with reference to the drawings. In the present embodiment, a description will be made as regards a method for manufacturing the semiconductor device 1 by using W-CSP (Wafer level Chip Scale Package) technology. More particularly, a plurality of semiconductor devices 1 is formed all together at the same time on a silicon wafer (semiconductor wafer). The relocation and rerouting are performed with respect to the semiconductor devices 1 and the semiconductor devices 1 are molded by a resin in order to divide the semiconductor devices 1 into individual semiconductor devices 1. FIGS. 2 to 12, each of which shows an intermediate process for manufacturing the semiconductor device 1, are simplified, and one semiconductor device 1 formed on the silicon wafer is illustrated in each of FIGS. 2 to 12. The semiconductor substrate 10 is equivalent to the silicon wafer used in the following manufacturing processes.

Process of Forming a Feedthrough Electrode

Figure 2:
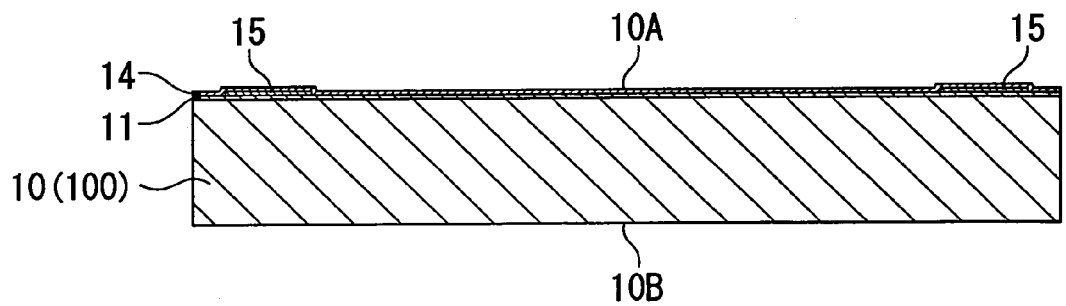
FIGS. 2 to 16 are cross-sectional views each of which describes a manufacturing process of the semiconductor device illustrated in FIG. 1.

As shown in FIG. 2, the foundation layer 11 is formed on the active surface 10A of the semiconductor substrate 10 composed of the silicon wafer. The electrodes 15 are formed on the foundation layer 11. The integrated circuit (not shown), which includes transistors, memory elements, and other electronic elements, is formed on the active surface 10A of the semiconductor substrate 10. The foundation layer 11 is an insulating layer and is composed of an oxide film ($SiO_2$) of silicon (Si). Each of the electrodes 15 is composed of titanium (Ti), titanium nitride (TiN), aluminum (Al), copper (Cr), or the like and is electrically connected to the integrated circuit. The first insulating layer 14 is formed so as to cover the foundation layer 11 and the electrodes 15.

The first insulating layer 14 is composed of polyimide resin, silicon denatured polyimide resin, epoxy resin, silicon denatured epoxy resin, acrylate resin, phenol resin, benzocyclobutene (BCB), polybenzooxazole (PBO), or the like. Alternatively, the first insulating layer 14 may be composed of an insulating material such as silicon dioxide ($SiO_2$) or silicon nitride (SiN).

Next, a photo-resist (not shown) is coated on an entire surface of the first insulating layer 11 by using a spin coating method. After the photo-resist is subjected to an exposure treatment by using a mask having a predetermined pattern, the photo-resist is subjected to a developing treatment, in order to form the predetermined pattern on the photo-resist.

Figure 3:
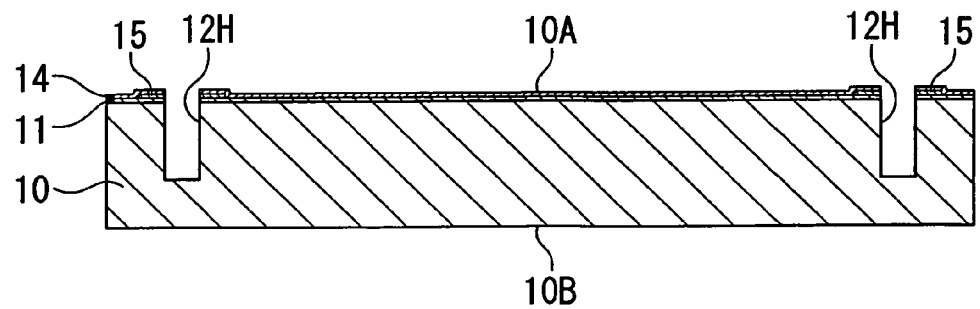

A portion of the first insulating layer 11 is removed by an etching treatment, in order to form opening portions. Using the photo-resist having the opening portions that is formed on the first insulating layer 11, as a mask, a portion of the foundation layer 11 and a portion of the semiconductor substrate 10 are removed while penetrating the electrodes 15 by dry etching. As shown in FIG. 3, the aperture portions 12H are formed at portion of the active surface 10A in the semiconductor substrate 10.

Figure 4:
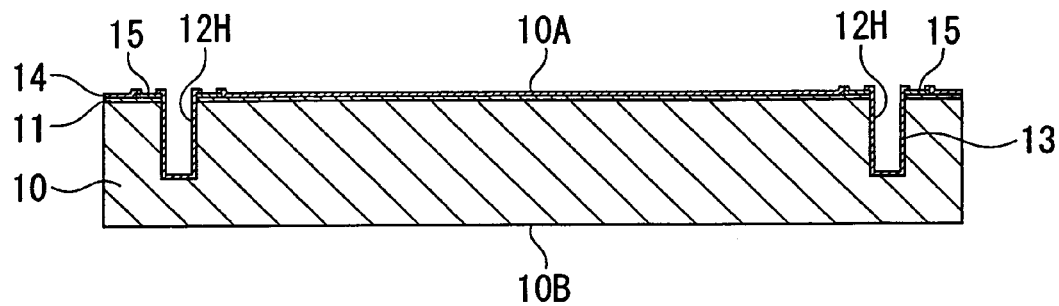

As shown in FIG. 4, an insulating film 13 is formed on the first insulating layer 14 and the inner wall and the bottom surface of each aperture portion 12H. The insulating film 13 is for preventing occurrence of current leakage and erosion of the semiconductor substrate 10 that is based on oxygen and water. It is possible to use Tetra Ethyl Ortho Silicate (Si (OC$_2$H$_5$)$_4$ which will be called TEOS hereinafter) formed by PECVD (Plasma Enhanced Chemical Vapor Deposition), namely, PE-TEOS, as the insulating film 13. Furthermore, it is possible to use TEOS formed by ozone CVD, namely, O$_3$-TEOS, as the insulating film 13. Alternatively, it is possible to use silicon dioxide (SiO$_2$) formed by CVD, as the insulating film 13. It is possible to use a material having insulation or a resin as the insulating film 13. For the sake of simplicity, the insulating film 13 formed on the first insulating layer 14 is not illustrated. The insulating film 13 and the first insulating layer 14, which are formed on the electrodes 15, are removed by etching.

Figure 5:
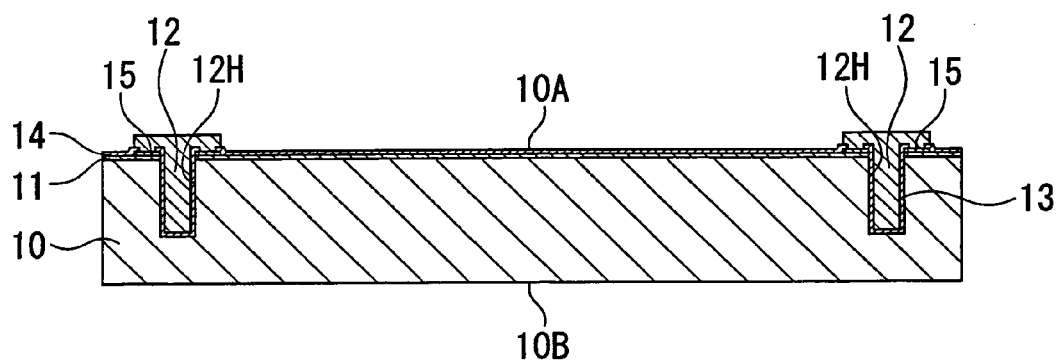

As shown in FIG. 5, plating is applied to the inner side of each aperture portion 12H and each electrode 15 by using an electrochemical plating (ECP) method. A conductive material, which is for use in forming the feedthrough electrodes 12, is embedded into each of the aperture portions 12H. For example, copper (Cu) is used as the conductive material for use in forming each of the feedthrough electrodes 12. Copper (Cu) is embedded into each of the aperture portions 12H. As a result, the feedthrough electrodes 12 are formed which project from the electrodes 15, respectively. It is preferable that each of the first electrode portions 12A have a height which is less than 20 μm, in each of the feedthrough electrodes 12 which projects to the active surface 10A of semiconductor substrate 10.

The process of forming the feedthrough electrodes 12 includes the process of forming (depositing) TiN and Cu by a sputtering method and the process of forming Cu by a plating method, in the present embodiment. In addition, the process of forming the feedthrough electrodes 12 may include the process of forming (depositing) TiW and Cu by a sputtering method and the process of forming Cu by a plating method. Conductive paste, melted metal, metal wire, or the like may be embedded into each of the aperture portions 12H on forming the feedthrough electrodes 12, without limiting the above-mentioned methods.

Process of Forming First Resin Layer

Figure 6:
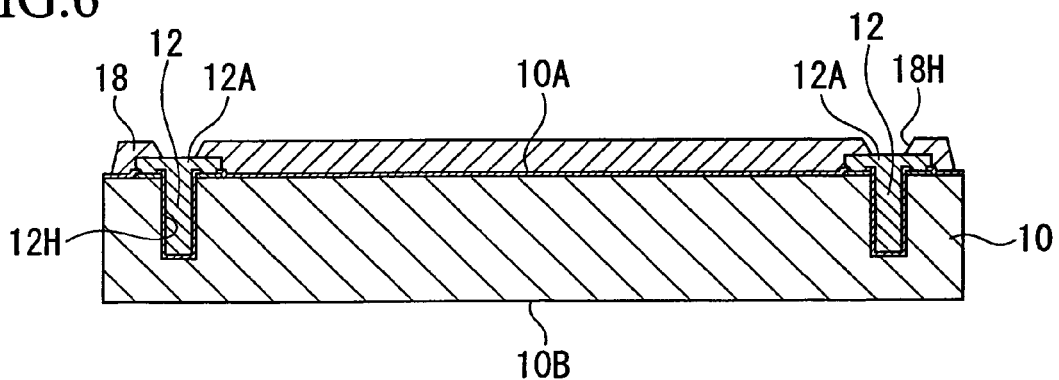

As shown in FIG. 6, the first resin layer 18 whose thickness is 20 μm is formed on the active surface 10A of semiconductor substrate 10. The first resin layer 18 has a thickness which is greater than the height of each of the first electrode portions 12A which project towards the side of the active surface 10A. It is preferable that the first resin layer 18 be formed so as not to overlap with a cut portion of the silicon wafer (semiconductor substrate 10) that will be described hereinafter. Under such circumstances, it is possible to prevent the first resin layer 18 from being cut and peeling off, during the cutting process of the silicon water into individual semiconductor devices 1.

To form the first resin layer 18, the above-mentioned polyimide resin, which is a photo-sensitive resin, is coated on the active surface 10A. The polyimide resin is subjected to an exposure and a development and the opening portions 18H are formed in the polyimide resin. At least a portion of each first electrode portion 12A is exposed by each opening portion 18H in each feedthrough electrode 12. In addition, dry etching may be used as the method of forming the opening portion 18H. Furthermore, it is possible to use an insulating resin such as silicone denatured polyimide resin, epoxy resin, silicone denatured epoxy resin, acrylate resin, phenol resin, benzocyclobutene (BCB), or polybenzooxazole (PBO), instead of polyimide resin.

It is possible to prevent each of the wiring layers 21 formed in a subsequent process from breakage, when each of the opening portions 18H has the taper shape in which the inner diameter becomes narrow towards each of the first electrode portions 12A. In the present embodiment, each of the opening portions 18H has a height less than the step which occurs between the semiconductor substrate 10 and each of the first electrode portions 12A.

In the manner described above, it is possible to form the first resin layer 18 on the semiconductor substrate 10.

Process of Forming Wiring Layer

Figure 7:
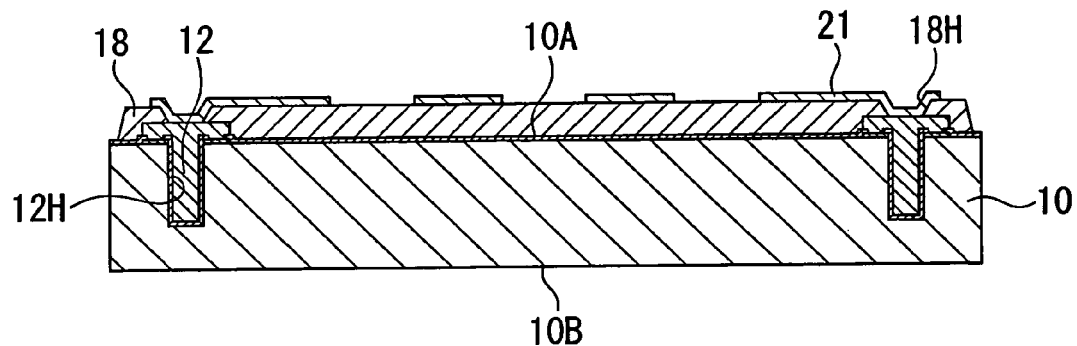

As shown in FIG. 7, the wiring layers 21, which are connected to the first electrode portions 12A through the opening portions 18H, are formed on the first resin layer 18.

Each of the wiring layers 21 is composed of a material which includes at least one selected from copper (Cu), chromium (Cr), titanium (Ti), nickel (Ni), titanium-tungsten (TiW), gold (Au), silver (Ag), aluminum (Al), nickel-vanadium (NiV), tungsten (W), titanium nitride (TiN), and palladium (P). For example, each of the wiring layers 21 is formed on the first resin layer 18 by a sputtering method. Alternatively, each of the wiring layers 21 may be composed of at least two materials which are deposited on the first resin layer 18. The process of forming the wiring layers 21 includes a process of plating Cu after forming TiW and Cu on the first resin layer 18 in an ascending order, in the invention. In addition, a conductive material may be ejected on the first resin layer 18 by an ink droplet ejecting method and may be baked in order to form the wiring layers 21 on the first resin layer 18.

Since each of the opening portions 18H has the taper shape as described above, it is possible to smoothly form each of the wiring layers 21 along each taper shape. As a result, it is possible to prevent each of the wiring layers 21 from breakage based on each of the steps which occurs between the semiconductor substrate 10 and the feedthrough electrodes 12. In addition, it is possible to reliably prevent each of the wiring layers 21 from breakage as compared with directly forming the wiring layers 21 on the feedthrough electrodes 12, since each of the opening portions 18H has a height which is lower than each of the steps between the semiconductor substrate 10 and the feedthrough electrodes 12, as described above.

In the manner described above, it is possible to form the wiring layers 21 which are connected to the first electrode portions 12A through the opening portions 18H, respectively.

Process of Forming Second Resin Layer

Figure 8:
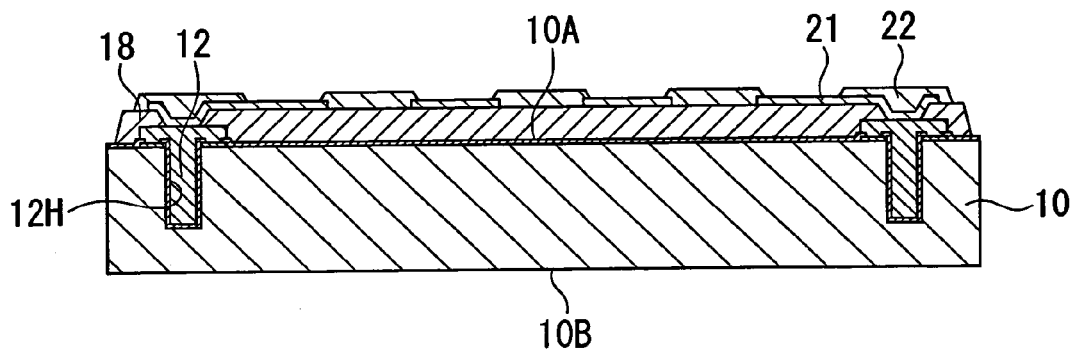

As shown in FIG. 8, the second resin layer 22 is formed on the first resin layer 18. The second resin layer 22 has a thickness which is greater than the thickness (which is less than 20 μm) of each of the wiring layers 21 and which is less than the thickness of the first resin layer 18. It is possible to use a material similar to that of the first resin layer 18, in the second resin layer 22.

To form the second resin layer 22, a resin material is coated on the first resin layer 18 so as to cover the entire surface of the first resin layer 18. For example, a photo-sensitive resin may be used as the second resin layer 22. When the second resin layer 22 is exposed and developed by using an exposure mask, a part of the second resin layer 22 is removed by development and is used for connecting the solder balls 23 which will be described hereinafter. In other words, the wiring layers 21 are partially exposed to the outside. In addition, the resin material may be ejected on a predetermined location by using the ink droplet ejecting method, in order to form the second resin layer 22 in which connecting sections for the solder balls 23 are exposed to the outside.

Since the wiring layers 21 are covered with the second resin layer 22 as described above, it is possible to protect the wiring layers 21 from external forces. In addition, it is possible to reduce the film stress which is applied to the second resin layer 22, since the second resin layer 22 has a thickness which is less than the thickness of the first resin layer 18. As a result, it is possible to reduce the warp which occurs in the semiconductor substrate 10. It is preferable that the second resin layer 22 be formed in an inner region which is located in the first resin layer in plan view.

In the manner described above, it is possible to reduce the area of the second resin layer 22 which is formed on the first resin layer 18. It is possible to further reduce the warp which occurs in the semiconductor substrate 10. In addition, the second resin layer 22 is not overlapped on the cut part of the silicon wafer (semiconductor substrate 10), since the second resin layer 22 is formed on the first resin layer 18 as described above. As a result, it is possible to prevent the second resin layer 22 from being cut and peeling off, during the cutting process of the silicon water into individual semiconductor devices 1.

Treatment of Thinning Semiconductor Substrate

Figure 9:
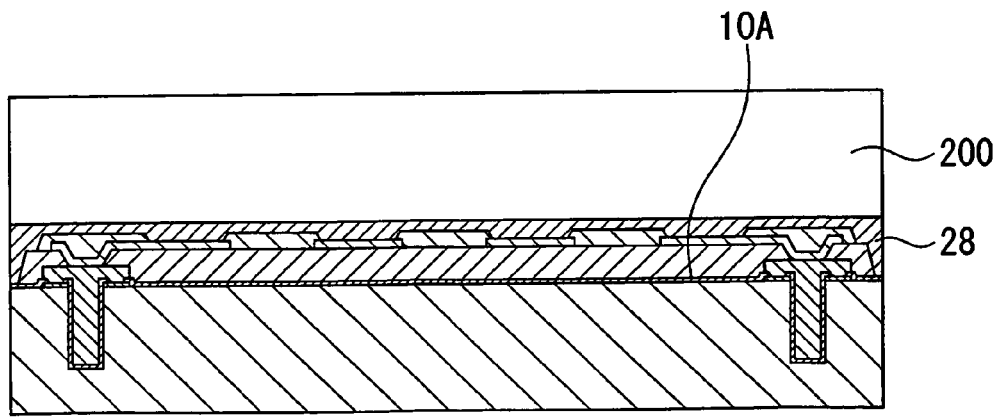

As shown in FIG. 9, a glass plate 200 is pasted on the side of the active surface 10A in the semiconductor substrate 10 by an adhesive 28 capable of being peeled by irradiation of ultraviolet light or rays (UV light). The glass plate 200 is a part of a so-called WSS (Wafer Support System) and the semiconductor substrate (silicon wafer) 10 are supported by the glass plate 200. In a condition of pasting the glass plate 200 on the semiconductor substrate (silicon wafer) 10, the semiconductor substrate 10 is subjected to a thinning process such as a grinding treatment, a dry etching treatment, or a wet etching treatment. The thinning process may be performed in combination with the above-mentioned treatments.

Figure 10:
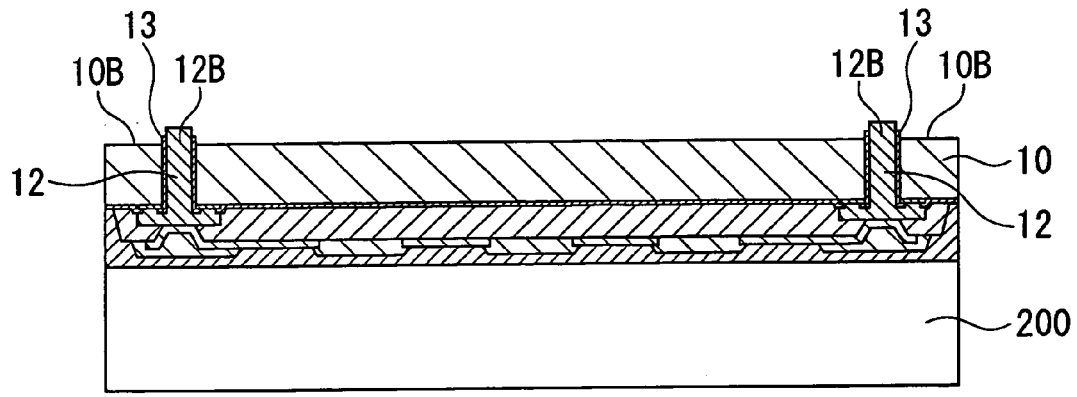

As a result, the semiconductor substrate 10 is thinned as shown in FIG. 10 and an end portion of each feedthrough electrode 12 is exposed from the side of the back surface 10B to form each second electrode portion 12B. The side surface portion of each second electrode portion 12B is partially covered with the insulating film 13.

In general, there is a concern that the semiconductor substrate 10 breaks, in a case of forming penetrated apertures in the thinned semiconductor substrate 10. In the invention, the above-mentioned WSS (Wafer Support System) is used after forming the aperture portions 12H in the semiconductor substrate 10. Therefore, it is possible to thin the semiconductor substrate 10 from its back surface 10B while supporting the semiconductor substrate 10 by the glass plate 200. As a result, it is possible to easily obtain the thinned semiconductor substrate 10 having the feedthrough electrodes 12.

Process of Forming Third Resin Layer

Figure 11:
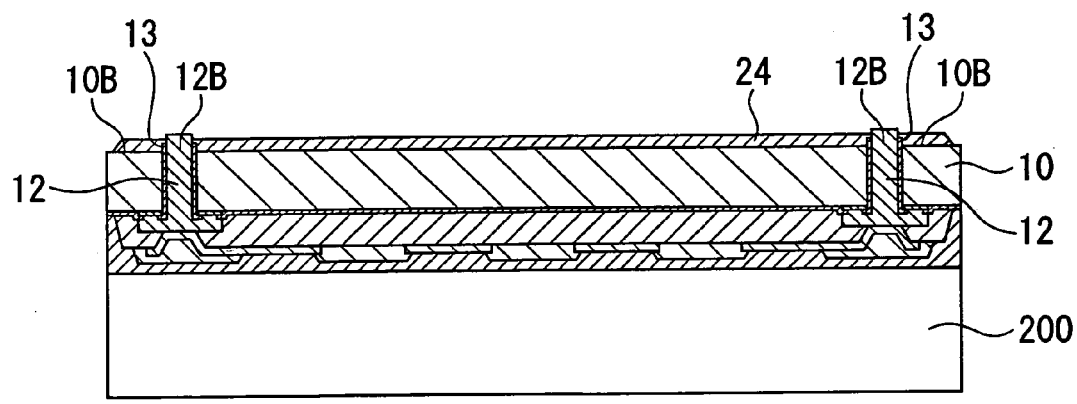

As shown in FIG. 11, the third resin layer 24, which exposes at least an end surface of each of the second electrode portions 12B in each of the feedthrough electrodes 12, is formed on the back surface 10B of the semiconductor substrate 10. The end surface of each of the second electrode portions 12B is exposed to an extent in which the second electrode portions 12B are capable of being electrically connected to the terminals of semiconductor chip, in a case of packaging the semiconductor chip on the second electrode portions 12B through the brazing filler metals.

The following method is used as the method of forming the third resin layer 24.

As a first method, the photo-sensitive resin is exposed by using the exposure mask and is developed after coating the photo-sensitive resin such as polyimide resin on the back surface 10B of the semiconductor substrate 10. As a result, opening portions are formed, each of which has a diameter greater than the external diameter of each of the second electrode portions 12B projecting to the side of the back surface 10B. Even if each of the feedthrough electrodes 12 has a small shape, it is possible to easily perform alignment of the third resin layer 24 with respect to the feedthrough electrodes 12, on forming the third resin layer 24.

By flowing a melted resin which occurs on thermally curing the photo-sensitive resin, the photo-sensitive resin is closely in contact with the feedthrough electrodes 12. In the manner described above, the third resin layer 24 is formed in a condition that the feedthrough electrodes 12 penetrate the third resin layer 24.

Since the third resin layer 24 formed on the back surface 10A of semiconductor substrate 10 controls the film stress which is applied to each of the first and the second resin layers 18 and 22 which are formed on the active surface 10A, it is possible to reduce the warp which occurs in the semiconductor substrate 10. Since the feedthrough electrodes 12 penetrate the third resin layer 24, each of the feedthrough electrodes 12 is in contact with the side wall portion of third resin layer 24. Therefore, it is possible to prevent short-circuitting since the brazing filler metals are directly in contact with the silicon part of the semiconductor substrate 10 that is located on the side of the back surface 10B, even if the brazing filler metals between the feedthrough electrodes 12 falls when the semiconductor chip is packaged on the semiconductor device 1.

As a second method, the second electrode portions 12B are exposed to the outside by using plasma treatment, after coating the polyimide resin on the entire back surface 10B of semiconductor substrate 10 by the spin coating method so as to cover the second electrode portion 12B, in order to form the third resin layer 24.

It is preferable that the resin coated by the spin coating method have a film thickness in which each of the second electrode portions 12B projecting from the back surface 12B is slightly covered with the resin. In the manner described above, it is possible to shorten the time duration during which the plasma treatment is performed, since the amount of resin which is removed by the plasma treatment is reduced.

In addition, it is unnecessary to perform a correct alignment with respect to the semiconductor substrate 10, since the spin coating method is used on forming the third resin layer 24. As a result, it is possible to simplify the process of forming the third resin layer 24.

As a third method, the second electrode portions 12B of the feedthrough electrodes 12, which project to the back surface 10B of the semiconductor substrate 10, are covered with a polymer film which becomes the third resin layer 24. The polymer film is heated and is crimped in order to paste the polymer film on the back surface 10B. As a result, each of the second electrode portions 12B projecting from the back surface 10B penetrates the polymer film. The plasma treatment may be used in which each of the second electrode portions 12B does not sufficiently penetrate the polymer film. It is possible to use a half-hardened polymer film, a liquid crystal polymer film, or the like as the polymer film.

In the manner described above, it is possible to form the third resin layer 24 which is penetrated by the feedthrough electrodes 12.

Similarly, it is possible to simplify the process of forming the third resin layer 24, since it is unnecessary to perform the correct alignment with respect to the semiconductor substrate 10 in the third method.

Figure 12:
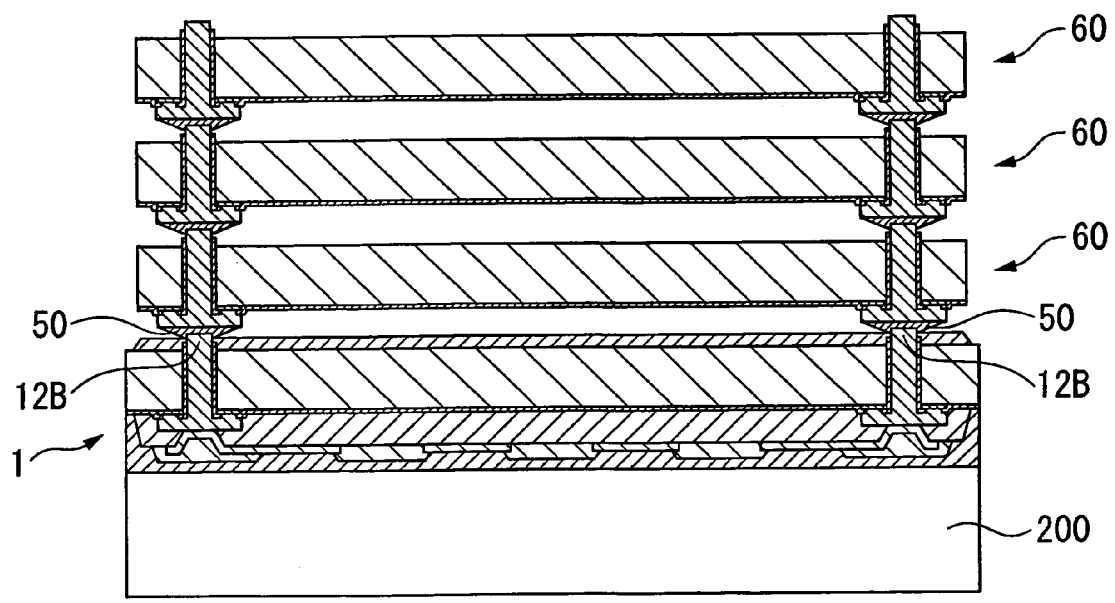

As shown in FIG. 12, a solder layer 50 composed of Sn—Ag is formed on each of the second electrode portions 12B projecting from the back surface 10B of the semiconductor substrate 10, as the brazing filler metal. It is possible to package electronic parts 60 all together on the semiconductor device 1 by using a method of heating and crimping the electronic parts 60 by a bonding tool or by using a reflow technology, as such a stacking method.

Figure 13:
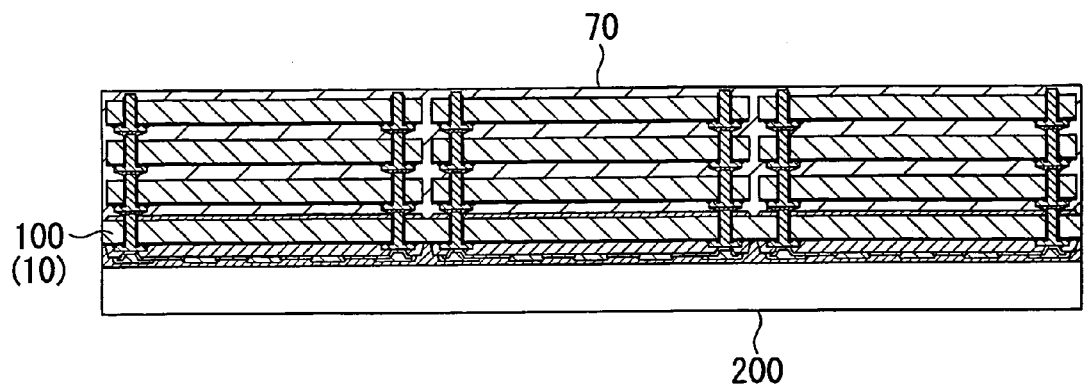

After stacking the electronic parts 60 on the semiconductor device 1, the semiconductor device 1 and the electronic parts 60 are molded by a resin 70 such as epoxy resin or silicone resin as shown in FIG. 13, in order to protect the connecting section between the semiconductor device 1 and the electronic parts 60 stacked on the semiconductor device 1. FIGS. 13 to 16 show views, each of which illustrates the process of manufacturing a plurality of semiconductor devices 1 on the silicon wafer (semiconductor substrate 10) 100. In order to simplify the drawings, the above-mentioned reference numerals are omitted in FIGS. 13 to 17.

In order that the remaining stress based on the molded resin 70 hardly occurs, it is preferable to use a low stress resin as the resin 70. In a manner described above, it is possible to improve moisture-resistant reliability since the stacked electronic parts are covered with the resin. It is possible to improve the reliability of the semiconductor device 1 having the above-mentioned stacked section.

Figure 14:
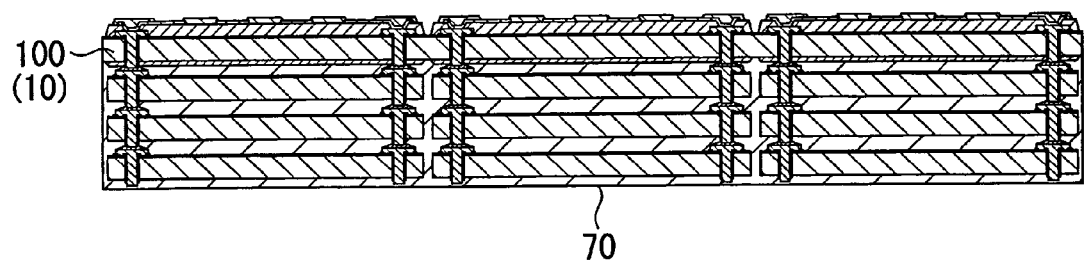

As shown in FIG. 14, the glass plate 200, which is a part of the WSS (Wafer Support System) for supporting the semiconductor substrate 10, is peeled off. As described above, the glass plate 200 is pasted on the semiconductor substrate 10 by the adhesive 28, and is capable of being peeled away by irradiation with ultraviolet light (UV light). When irradiating the ultraviolet light (UV light) from the side of glass plate 200, it is possible to peel away the glass plate 200 from the semiconductor substrate 10. In other words, it is possible to separate the glass plate 200 from the semiconductor substrate 10.

Figure 15:
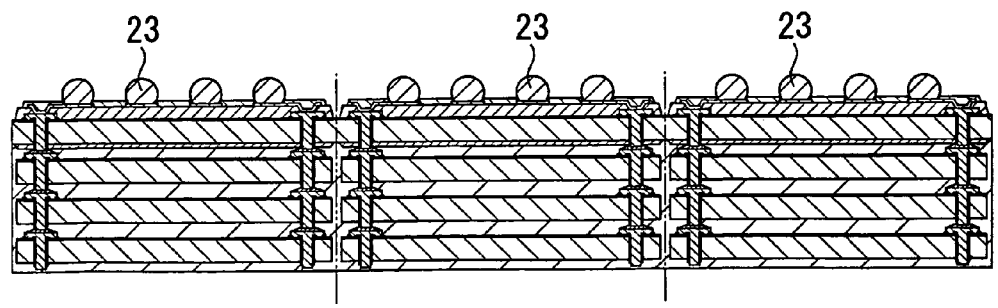

As shown in FIG. 15, the solder balls 23, each of which is composed of a lead-free solder, are mounted on the part positioned at the second resin layer 22 for exposing the wiring layers 21 to the outside. Since the second resin layer 22 exposes each of the wiring layers 21, which are connected to each of the solder balls 23, it is possible to use the second resin layer 22 as a partition wall on forming the solder balls 23. Solder pastes may be printed on the wiring layers 21 instead of the solder balls 23.

Finally, each silicon wafer 100 is cut off in order to obtain individual semiconductor devices 1, each of which is formed on the semiconductor substrate 10 as illustrated by a chain double-dashed line in FIG. 15.

Figure 16:
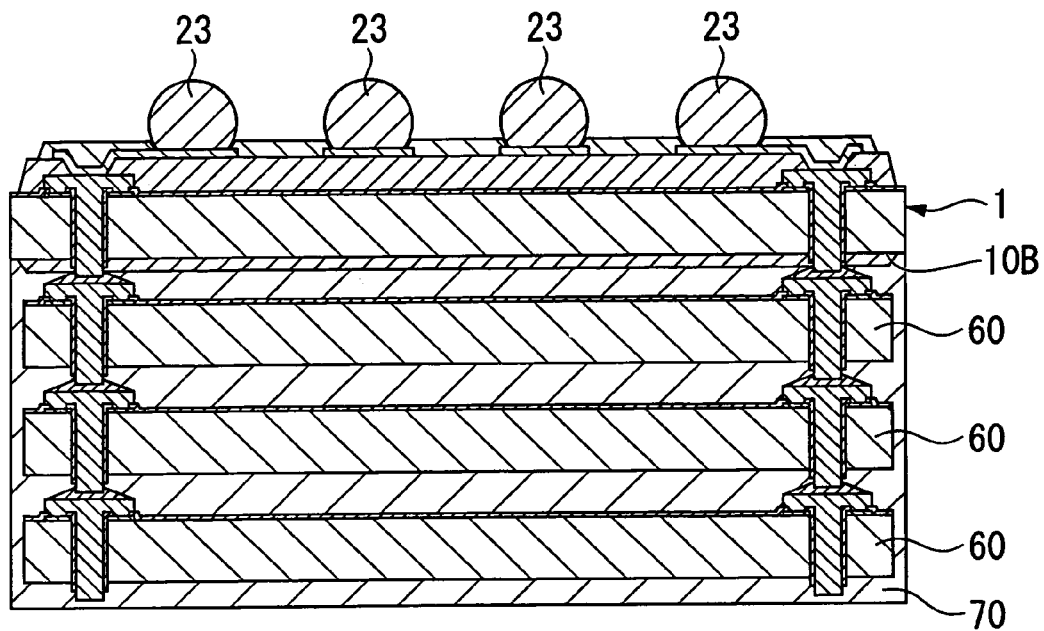
Figure 17:
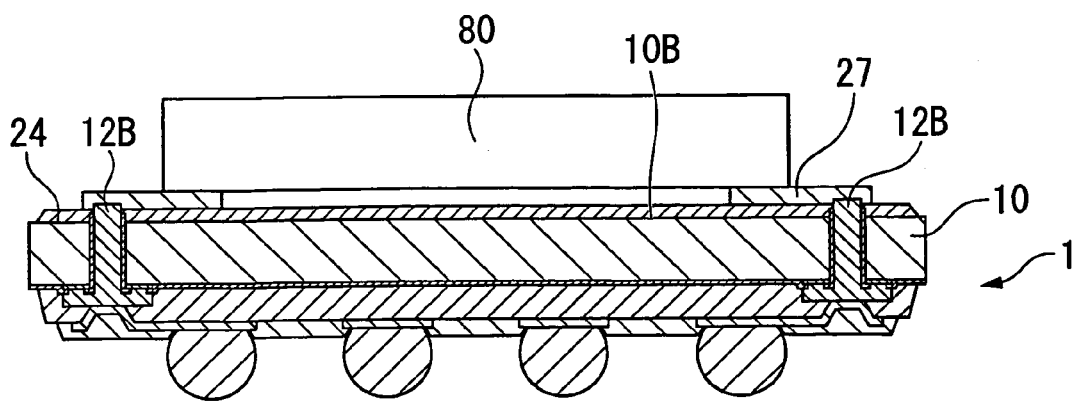
FIG. 17 is a cross-sectional view of a semiconductor device according to another embodiment of an aspect of the invention.

In the manner described above, it is possible to obtain the semiconductor device 1 on which a plurality of electronic parts 60 are stacked, as shown in FIG. 16.

According to the semiconductor device 1 of an aspect of the invention, it is possible to prevent the wiring layers 21 from breakage based on the opening portions 18H, since the height of each opening portion 18H is lower than the height of each feedthrough electrode 12 which projects from the semiconductor substrate 10, on forming the wiring layers 21. In addition, it is possible to smoothly connect each of the wiring layers 21 to each of the feedthrough electrodes 12 along each of the taper shapes, since each of the opening portions 18H has the taper shape. Furthermore, it is possible to improve connecting reliability in the connecting sections between the wiring layers 21 and the feedthrough electrodes 12, since the first resin layer 18 functions as a stress reducing layer even if external forces are applied to the solder balls 23 on packaging the semiconductor device 1 on the semiconductor substrate 10.

Since the solder balls 23 are formed which are connected to the feedthrough electrodes 12, it is possible to form relocation wirings on the semiconductor device 1 and it is unnecessary to use an interposer substrate. As a result, it is possible to downsize the semiconductor device 1 since it is unnecessary to use an interposer substrate.

In addition, it is possible to obtain a small semiconductor device 1 having a high performance, since the electronic parts 60 are packaged on the semiconductor device 1 which does not use an interposer substrate.

It is possible to perform various modifications in the invention without limiting the above-mentioned description. Although a description is made in the present embodiment about the feedthrough electrodes 12, each of which has the first and the second electrode portions 12A and 12B whose external diameters are different from each other, the first and the second electrode portions, which project from the active and the back surfaces 10A and 10B of the semiconductor substrate 10, respectively, may have shapes which are similar to each other.

In addition, the semiconductor devices 1 may be individually formed on the semiconductor substrate 10 and other semiconductor parts 60 may be stacked on each of the semiconductor devices 1, although a description is made in the present embodiment about forming the semiconductor devices 1 all together on the silicon wafer 100 at the same time.

Although a plurality of electronic parts 60 such as memory ICs having terminal locations similar to one another are stacked on the semiconductor device 1 in the present embodiment, semiconductor chips or electronic parts 80 having terminal locations different from one another may be stacked on the semiconductor device 1. At that time, second wiring layers 27 are formed which are connected to the second electrode portions 12B projecting to the side of back surface 10B in the semiconductor substrate 10. Through the second wiring layers 27, it is possible to stack the electronic parts 60 such as semiconductor chips having terminal locations different from one another.

As described above, it is possible to flexibly determine the terminal locations and positions of different types of semiconductor devices and electronic parts which are packaged on the semiconductor device 1, when variously positioning the second wiring layers 27, since the semiconductor device 1 has the second wiring layers 27 which are connected to the second electrode portions 12B.

Inductors, resistors, and capacitors may be formed on forming the second wiring layers 27. In addition, the second electrode portions 12B may be connected to an electronic device such as a surface acoustic wave device, a crystal resonator, a piezoelectric transducer, a piezoelectric tuning fork, or the like.

Figure 18:
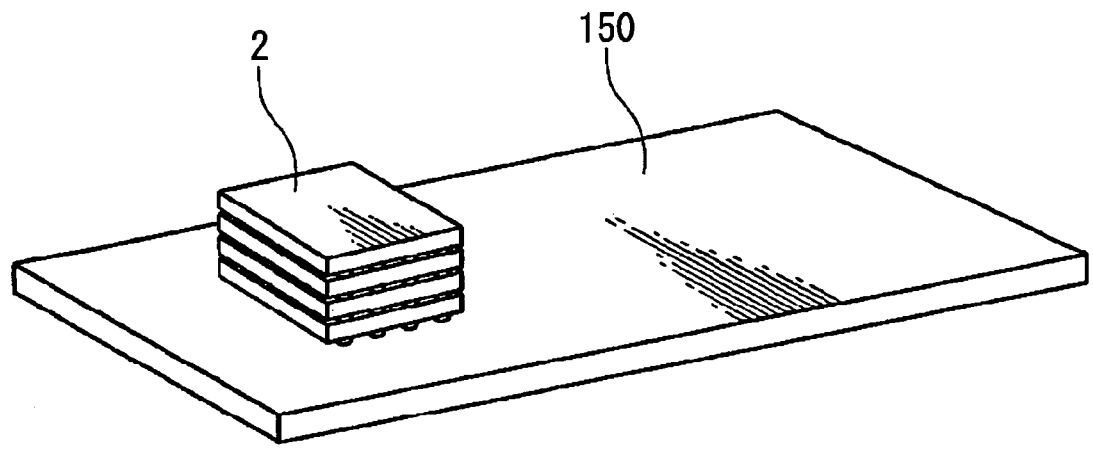
FIG. 18 is a view illustrating a circuit board having the semiconductor device.

Next, a description will proceed to a circuit board having the semiconductor device 1 according to an embodiment of the invention. FIG. 18 is a perspective view illustrating an outline structure of the circuit board according to the embodiment. As shown in FIG. 18, a stacked body 2 which is obtained by stacking the semiconductor chips on the semiconductor device 1 is mounted on a circuit board 150 of the present embodiment. The circuit board 150 is composed of an organic substrate such as a glass epoxy substrate. A wiring pattern (not shown) composed of copper is formed on the circuit board 150 so as to form a predetermined circuit. Electrode pads (not shown) are formed on the wiring pattern.

The solder balls 23 of the semiconductor device 1 are connected to the electrode pads, in order to package the stacked body 2 on the circuit board 150.

According to the circuit board 150 of the embodiment, it is possible to package the stacked body 2 having the semiconductor device 1 which does not use an interposer substrate on the circuit board 150.

In addition, it is possible to obtain a small circuit board 150 which has the stacked body including the semiconductor device 1 and which has high reliability, since the stacked body 2 has the semiconductor device 1 which prevents the relocation wirings from breakage and which is downsized and thinned.

Figure 19:
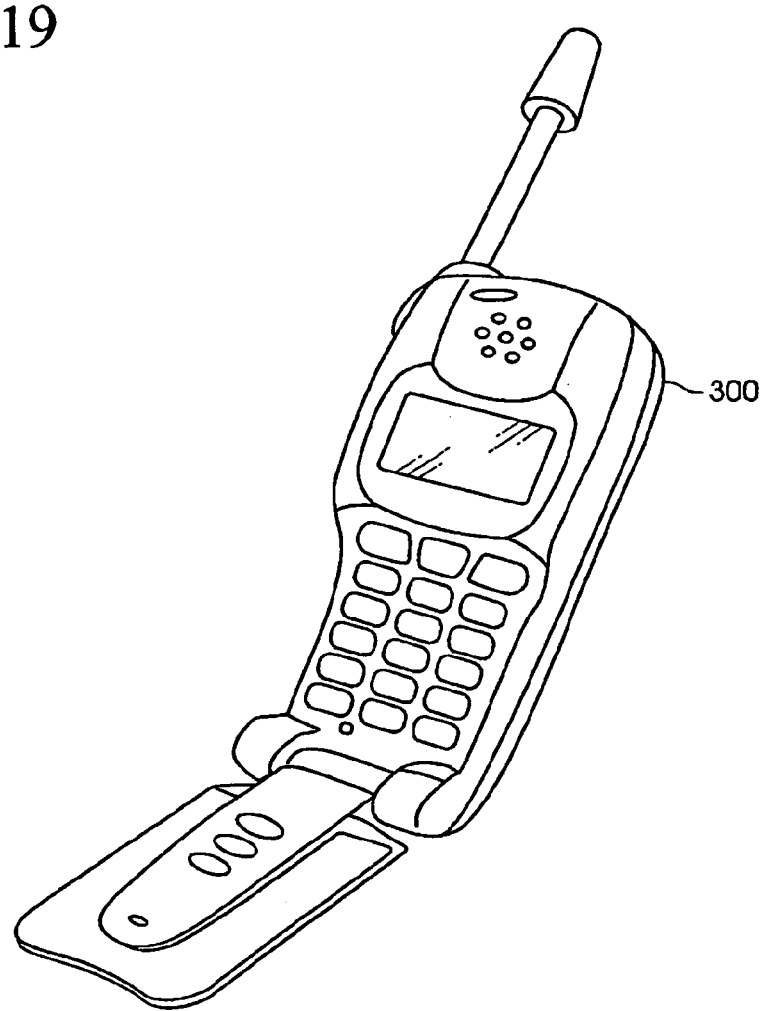
FIG. 19 is a view illustrating an electronic instrument having the circuit board.

Next, a description will proceed to an electronic instrument having the circuit board 150 according to an embodiment of the invention. FIG. 19 is a mobile phone 300 which is an electronic instrument according to the embodiment of the invention. The circuit board 150 is installed in the mobile phone 300.

According to the mobile phone 300 of the embodiment of the invention, it is possible to obtain a small mobile phone 300 which has the circuit board 150 and which has high reliability, since the mobile phone 300 has the small circuit board 150 having high reliability.

The electronic instrument is not limited to the mobile phone 300. It is possible to use the circuit board 150 in various electronic instruments. More particularly, it is possible to use the circuit board 150 in an electronic instrument such as a liquid crystal projector, a personal computer (PC) for use with multi-media, an engineering work station (EWS) for use multi-media, a pager, a word processor, a television, a viewfinder type or monitor direct-view type video tape recorder, an electronic organizer, an electronic desk calculator, a car navigation system, a POS terminal device, an apparatus having a touch panel, or the like.

While preferred embodiments of the invention have been described and illustrated above, it should be understood that these are exemplary of the invention and are not to be considered as limiting. Additions, omissions, substitutions, and other modifications can be made without departing from the sprit or scope of the invention. Accordingly, the invention is not be considered as being limited by the foregoing description, and is only limited by the scope of the appended claims.

What is claimed is:

1. A semiconductor device comprising:
    a semiconductor substrate having an active surface and a back surface;
    an integrated circuit formed on the active surface;
    a feedthrough electrode penetrating the semiconductor substrate, having a first electrode portion, and projecting from the active surface and the back surface;
    a first resin layer formed on the active surface, having a thickness greater than a height of the first electrode portion of the feedthrough electrode that projects from the active surface, and having an opening portion for exposing at least a portion of the first electrode portion of the feedthrough electrode, the opening portion being tapered in which the opening portion has an inner diameter which becomes narrower towards the first electrode portion;
    a wiring layer which is formed on the first resin layer so as to be smoothly formed along the taper of the opening portion, and which is connected to the feedthrough electrode through the opening portion; and
    an external connecting terminal connected to the wiring layer.

2. A semiconductor device according to claim 1, further comprising:
    a second resin layer formed on the first resin layer, having a thickness greater than a thickness of the wiring layer, and less than a thickness of the first resin layer, and exposing a portion of the wiring layer connected to the external connecting terminal.

3. A semiconductor device according to claim 2, wherein, the second resin layer is formed in a region which is positioned in the first resin layer in plan view.

4. A semiconductor device according to claim 1, further comprising:
    a third resin layer formed on the back surface of the semiconductor substrate, and exposing at least an end surface of the feedthrough electrode.

5. A semiconductor device according to claim 1, further comprising:
    other semiconductor device or electronic elements connected to a portion of the feedthrough electrode that projects from the back surface of the semiconductor substrate.

6. A semiconductor device according to claim 5, further comprising:
    a second wiring layer connected to the portion of the feedthrough electrode that projects from the back surface of the semiconductor substrate.

7. A semiconductor device according to claim 5, further comprising:
    a resin molding the other semiconductor device or the electronic parts which are packaged on the back surface.

8. A circuit board comprising the semiconductor device according to claim 1.

9. An electronic instrument comprising the circuit board according to claim 8.

* * * * *